(12) United States Patent
Kwon et al.

(10) Patent No.: US 9,368,593 B2
(45) Date of Patent: Jun. 14, 2016

(54) MULTIPLE THICKNESS GATE DIELECTRICS FOR REPLACEMENT GATE FIELD EFFECT TRANSISTORS

(71) Applicant: International Business Machines Corporation, Armonk, NY (US)

(72) Inventors: Unoh Kwon, Fishkill, NY (US); Wing L. Lai, Williston, VT (US); Vijay Narayanan, New York, NY (US); Sean M. Polvino, Brooklyn, NY (US); Ravikumar Ramachandran, Pleasantville, NY (US); Shahab Siddiqui, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/875,049

(22) Filed: Oct. 5, 2015

(65) Prior Publication Data

US 2016/0027893 A1 Jan. 28, 2016

Related U.S. Application Data

(62) Division of application No. 14/179,074, filed on Feb. 12, 2014, now Pat. No. 9,224,826.

(51) Int. Cl.
*H01L 29/76* (2006.01)
*H01L 29/94* (2006.01)
(Continued)

(52) U.S. Cl.
CPC ...... *H01L 29/513* (2013.01); *H01L 21/823462* (2013.01); *H01L 27/088* (2013.01);
(Continued)

(58) Field of Classification Search
CPC ...... H01L 29/49; H01L 29/4933; H01L 29/94
See application file for complete search history.

(56) References Cited

U.S. PATENT DOCUMENTS

| 7,138,691 | B2 | 11/2006 | Burnham et al. |
| 7,910,467 | B2 | 3/2011 | Hsu et al. |
| 2009/0181530 | A1 | 7/2009 | Lisiansky et al. |
| 2010/0075507 | A1 | 3/2010 | Chang et al. |

(Continued)

OTHER PUBLICATIONS

Simoen, E. et al., "Low-Frequency Noise Behavior of SiO2—HfO2 Dual-Layer Gate Dielectric nMOSFETs With Different Interfacial Oxide Thickness" IEEE Transactions on Electron Devices (May 2004) pp. 780-784, vol. 51, No. 5.

(Continued)

*Primary Examiner* — Hoai V Pham
(74) *Attorney, Agent, or Firm* — Scully, Scott, Murphy & Presser, P.C.; Steven J. Meyers

(57) ABSTRACT

After removal of the disposable gate structures to form gate cavities in a planarization dielectric layer, a silicon oxide layer is conformally deposited on silicon-oxide-based gate dielectric portions in the gate cavities. A portion of the silicon oxide layer can be nitridated to form a silicon oxynitride layer. A patterned masking material layer can be employed to physically expose a semiconductor surface from a first-type gate cavity. The silicon oxide layer can be removed while preserving an underlying silicon-oxide-based gate dielectric portion in a second-type gate cavity. A stack of a silicon oxynitride layer and an underlying silicon-oxide-based gate dielectric can be protected by a patterned masking material layer in a third-type gate cavity during removal of the silicon oxide layer in the second-type gate cavity. A high dielectric constant gate dielectric layer can be formed in the gate cavities to provide gate dielectrics of different types.

10 Claims, 11 Drawing Sheets

(51) Int. Cl.
| | |
|---|---|
| *H01L 31/062* | (2012.01) |
| *H01L 31/113* | (2006.01) |
| *H01L 31/119* | (2006.01) |
| *H01L 29/51* | (2006.01) |
| *H01L 29/40* | (2006.01) |
| *H01L 27/088* | (2006.01) |
| *H01L 21/8234* | (2006.01) |
| *H01L 29/49* | (2006.01) |
| *H01L 29/66* | (2006.01) |
| *H01L 29/423* | (2006.01) |

(52) U.S. Cl.
CPC ........ *H01L29/401* (2013.01); *H01L 29/42368* (2013.01); *H01L 29/4966* (2013.01); *H01L 29/518* (2013.01); *H01L 29/66545* (2013.01)

(56) References Cited

U.S. PATENT DOCUMENTS

2012/0289040 A1* 11/2012 Huang ............ H01L 21/823842
 438/591
2012/0329230 A1 12/2012 Chudzik et al.
2014/0077281 A1 3/2014 Won et al.

OTHER PUBLICATIONS

Wu, Y. et al., "Improvement of Gate Dielectric Reliability for p+ Poly MOS Devices Using Remote PECVD Top Nitride Deposition on Thin Gate Oxides" Proceedings of the 36th Annual IEEE International Reliability Physics Symposium (Mar. 1998) pp. 70-72.

Manchanda, L. et al.,"A boron-retarding and high interface quality thin gate dielectric for deep-submicron devices" Proceedings of IEEE International Electron Devices Meeting (Dec. 5-8, 1993) pp. 459-462.

* cited by examiner

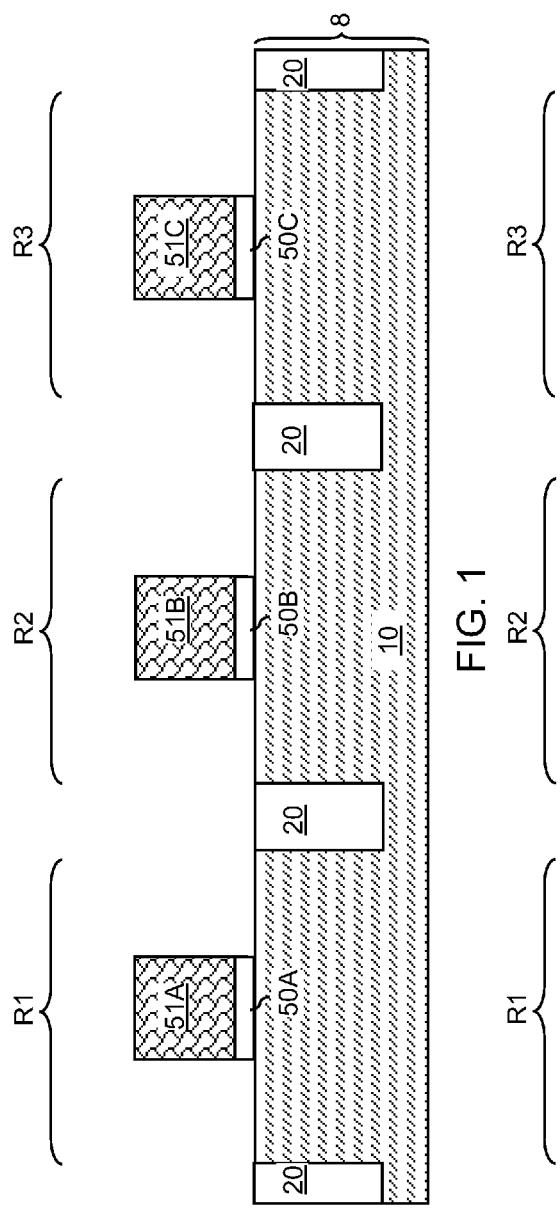
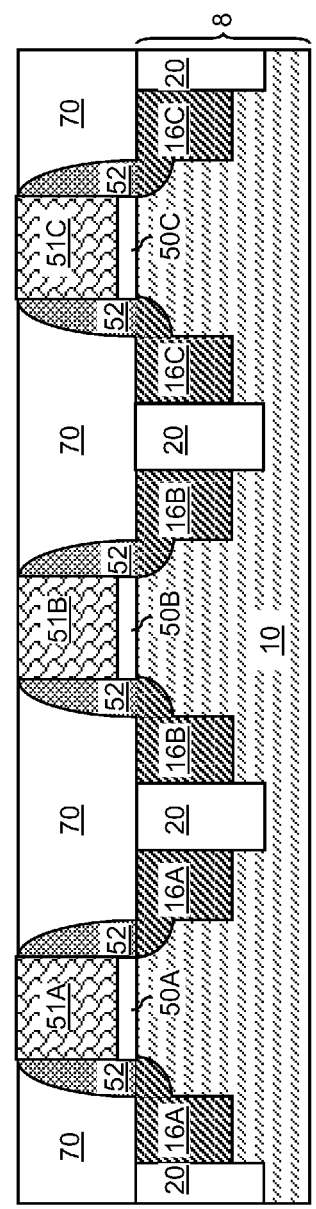
FIG. 1
FIG. 2

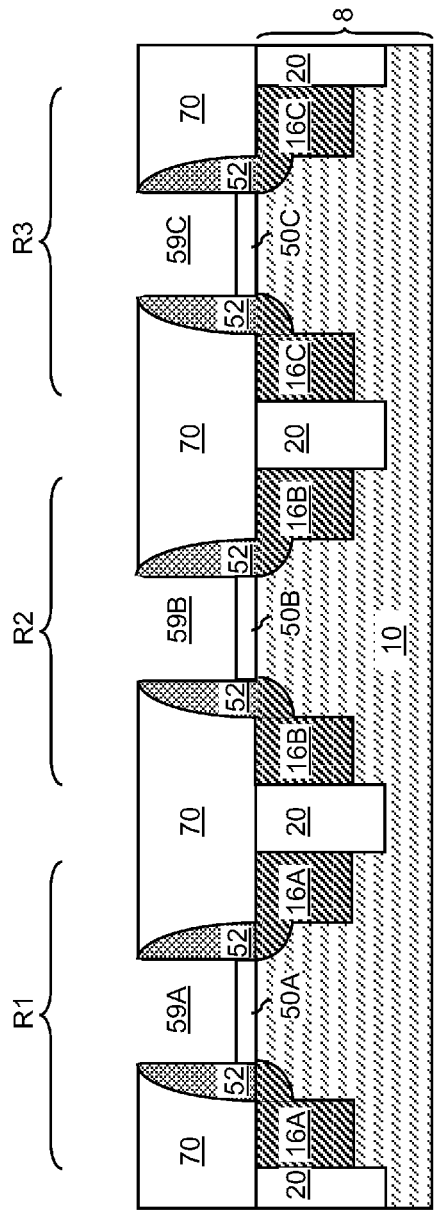
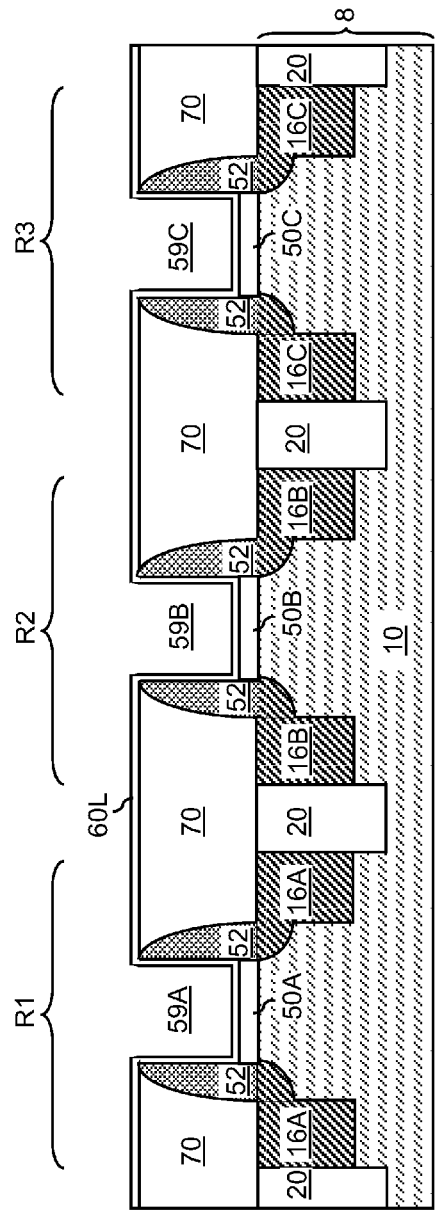
FIG. 3
FIG. 4

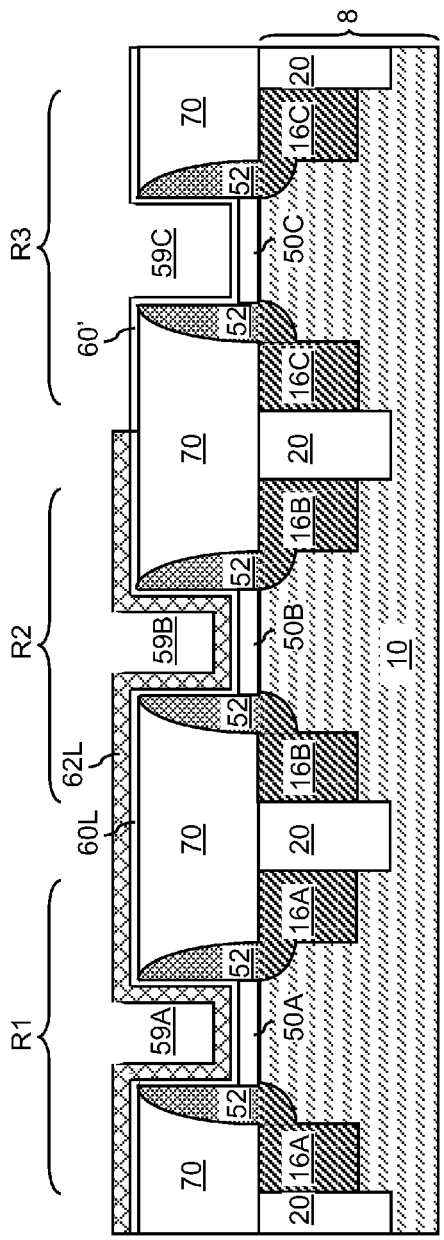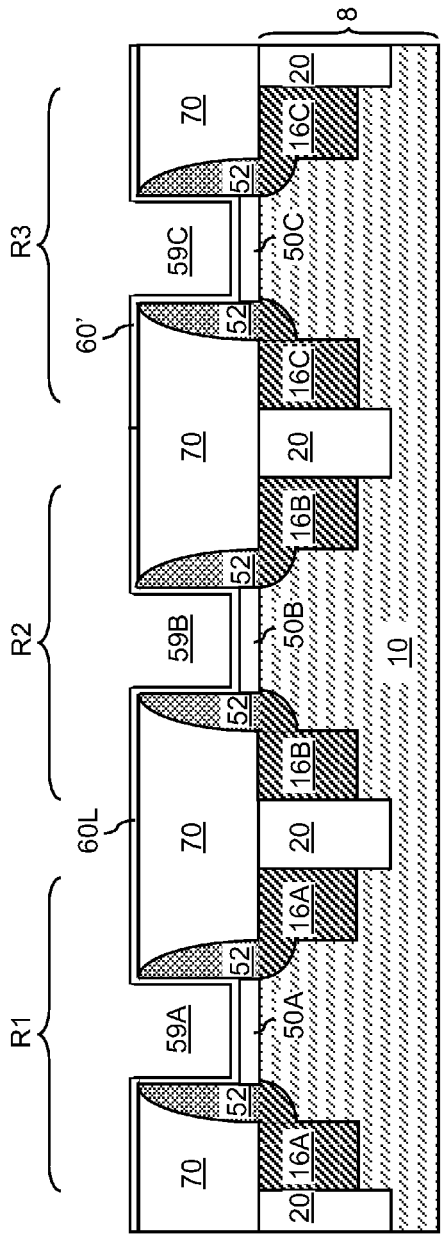

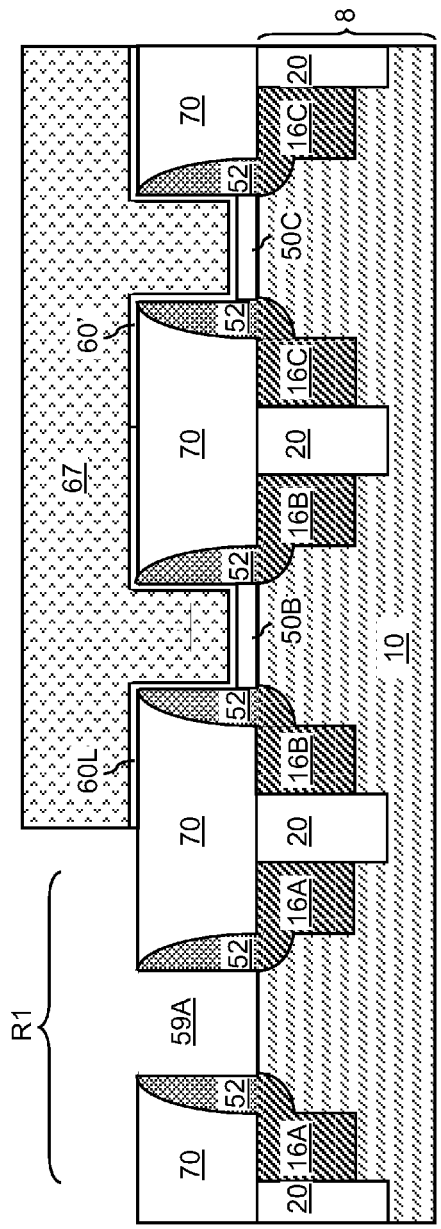
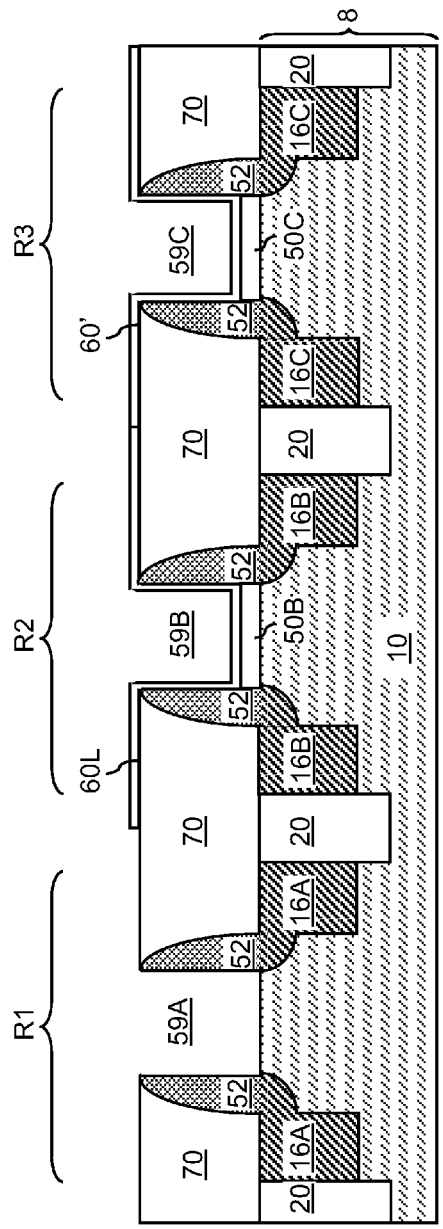
FIG. 9
FIG. 10

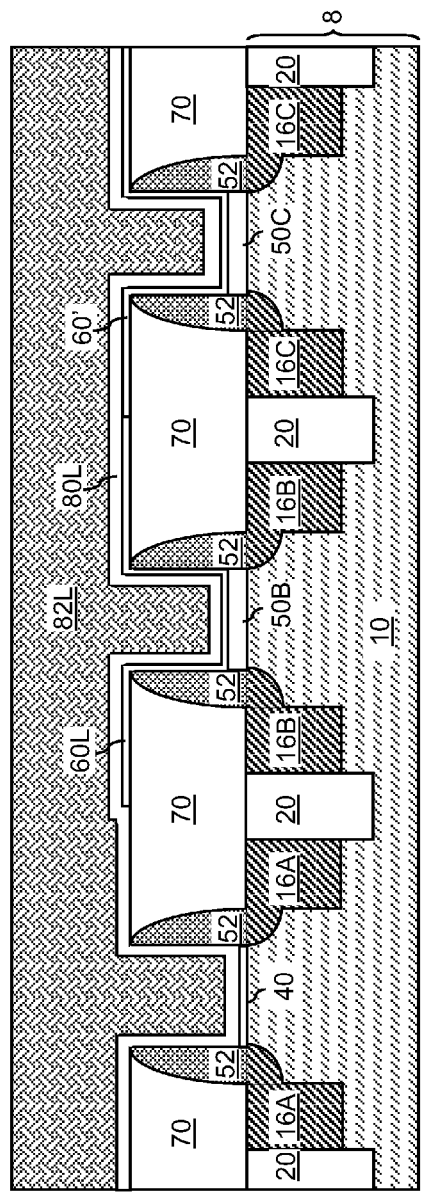
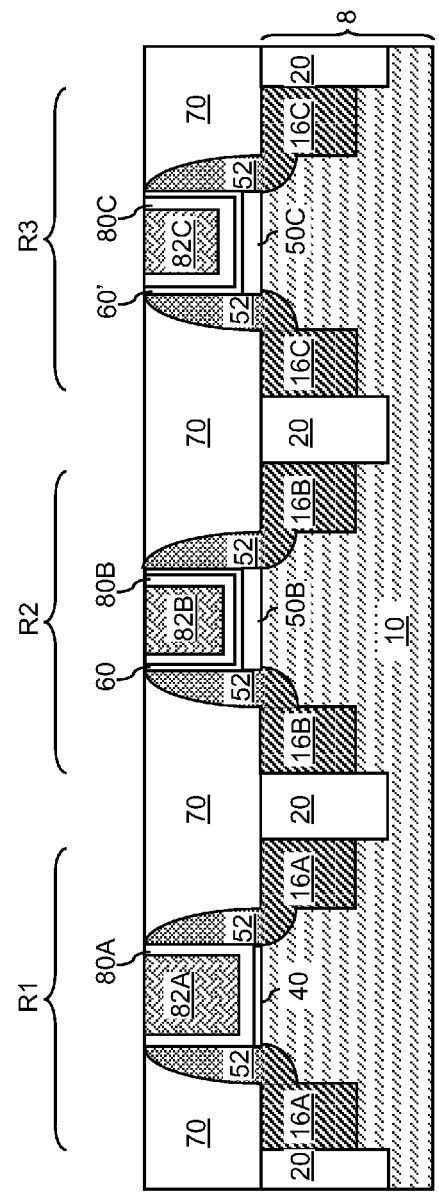
FIG. 11
FIG. 12

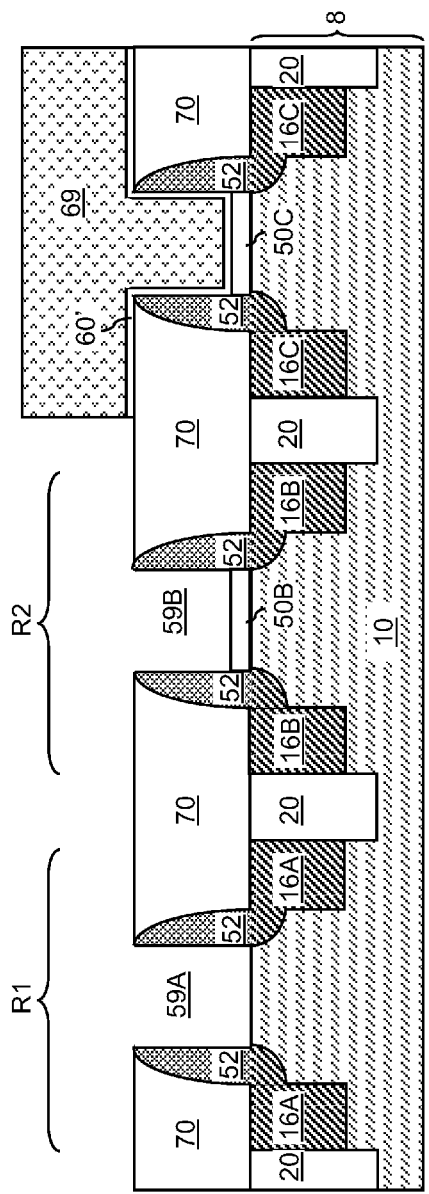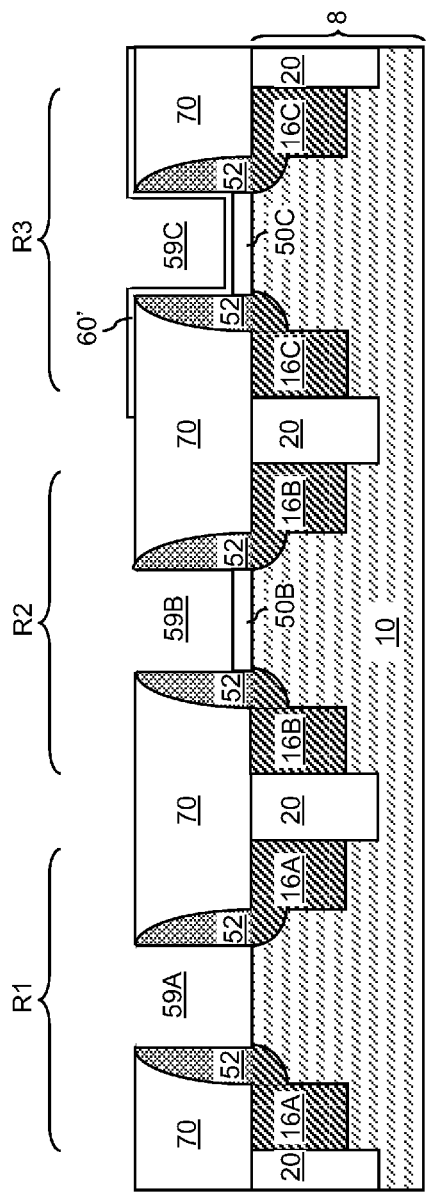

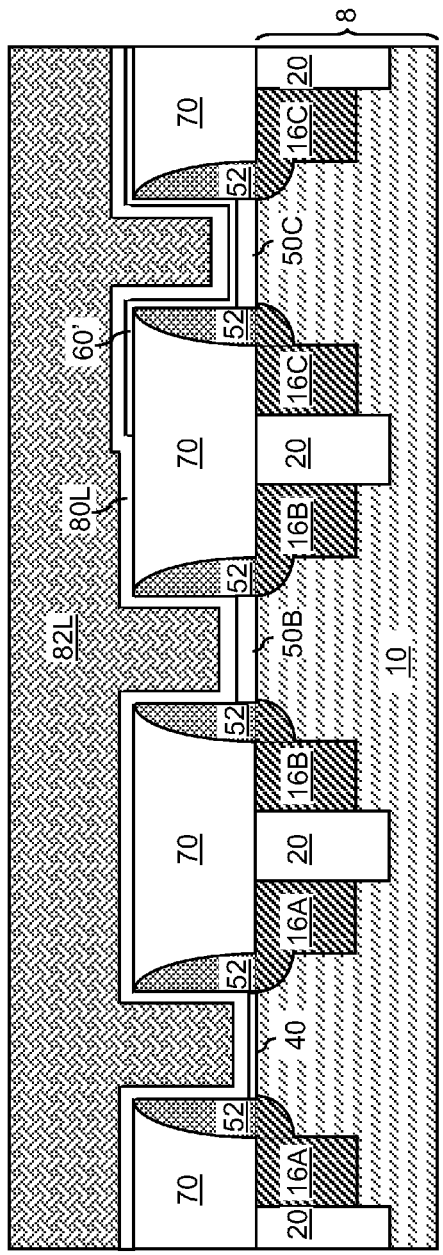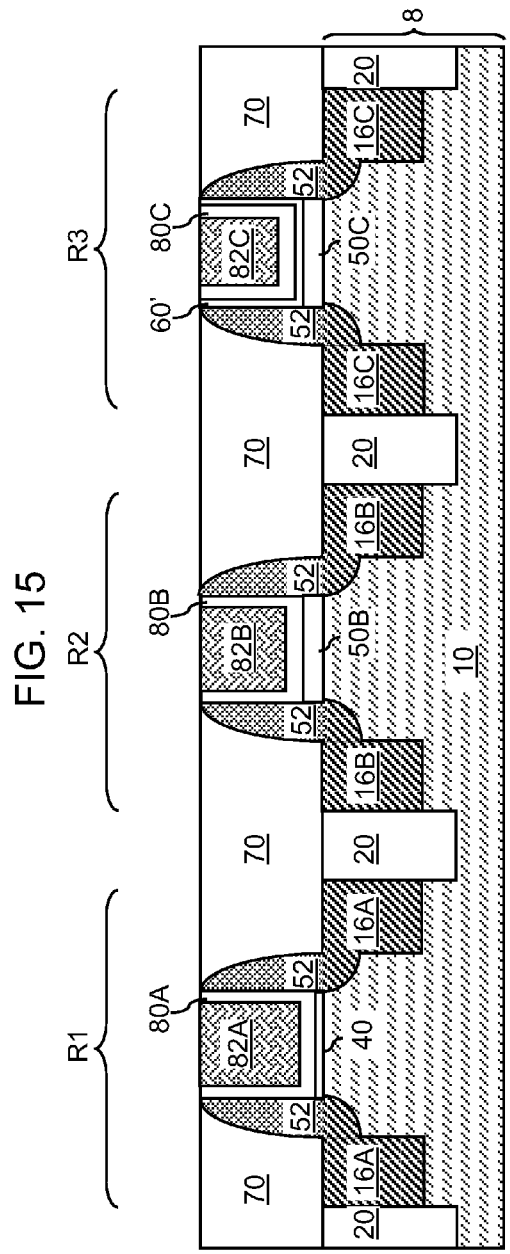
FIG. 15
FIG. 16

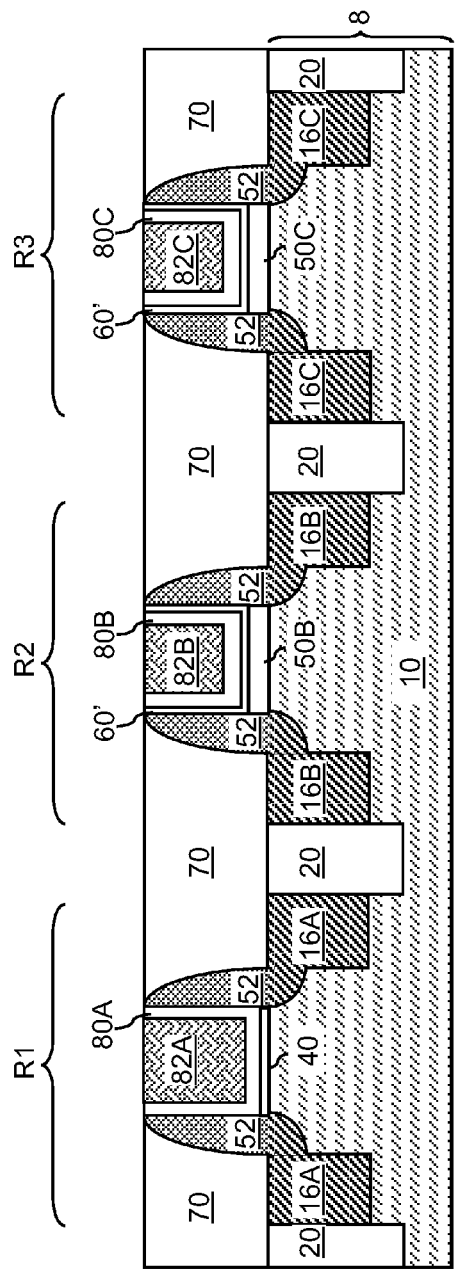
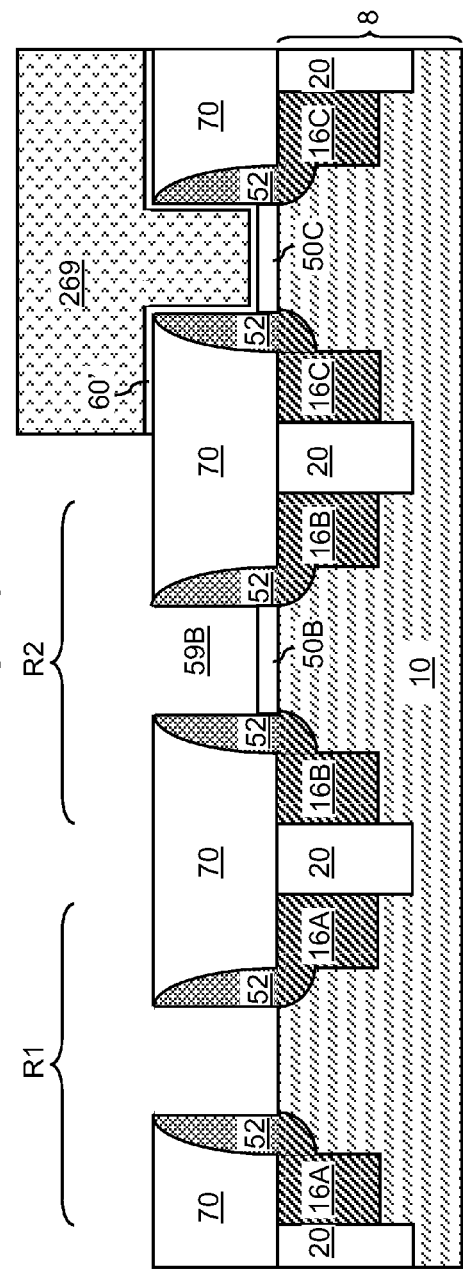

MULTIPLE THICKNESS GATE DIELECTRICS FOR REPLACEMENT GATE FIELD EFFECT TRANSISTORS

This is a divisional of application Ser. No. 14/179,074 filed Feb. 12, 2014, now U.S. Pat. No. 9,224,826.

BACKGROUND

The present disclosure relates to a method of forming a semiconductor structure, and particularly to a method of forming multiple gate dielectrics having different thicknesses, and structures formed by the same.

Gate dielectrics having different thicknesses are useful in providing a variety of field effect transistors on a same substrate. Replacement gate field effect transistors are compatible with high dielectric constant (high-k) gate dielectrics and metal gates. However, integration schemes that employ replacement gate field effect transistors tend to physically expose silicon-oxide-based dielectric material portions to damaging etch processes prior to deposition of a high-k gate dielectric material thereupon. In order to provide reliable semiconductor devices of various types, an integration scheme is desired that allows use of replacement gate structures with multiple types of gate dielectrics without damaging silicon-oxide-based dielectric material portions.

SUMMARY

Vertical stacks of a silicon-oxide-based gate dielectric portion and a disposable gate structure can be formed on a semiconductor substrate. Gate spacers, source and drain regions, and a planarization dielectric layer can be formed. After removal of the disposable gate structures to form a gate cavity, a silicon oxide layer is conformally deposited on the silicon-oxide-based gate dielectric portions. A patterned metallic oxidation barrier layer can be employed to nitridate a portion of the silicon oxide layer to form a silicon oxynitride layer, while preserving other portions of the silicon oxide layer. After removal of the patterned metallic oxidation barrier layer, a patterned masking material layer can be employed to physically expose a semiconductor surface from a first-type gate cavity. The silicon oxide layer can be removed while preserving an underlying silicon-oxide-based gate dielectric portion in a second-type gate cavity. A stack of a silicon oxynitride layer and an underlying silicon-oxide-based gate dielectric can be protected by a patterned masking material layer in a third-type gate cavity during removal of the silicon oxide layer in the second-type gate cavity. A high dielectric constant gate dielectric layer and a gate electrode can be formed in the gate cavities to provide gate dielectrics of different types.

According to an aspect of the present disclosure, a method of forming a semiconductor structure is provided. Gate cavities surrounded by a planarization dielectric layer are provided over a semiconductor substrate. A top surface of a semiconductor oxide-based dielectric portion is physically exposed at a bottom of each of the gate cavities. A silicon oxide layer is deposited on each of the semiconductor oxide-based dielectric portions. At least a portion of the silicon oxide layer is nitridated to form a silicon oxynitride layer. A surface of the semiconductor substrate is physically exposed within a gate cavity among the gate cavities, while preventing removal of the silicon oxynitride layer in another gate cavity among the gate cavities. A high dielectric constant (high-k) gate dielectric layer is formed in the gate cavity and the other gate cavity. The gate cavity and the other gate cavity are filled with a conductive material.

According to another aspect of the present disclosure, a semiconductor structure is provided. The semiconductor structure contains a gate dielectric including a chemical oxide layer contacting a first surface of a semiconductor substrate and a U-shaped gate dielectric portion including a high dielectric constant (high-k) gate dielectric material contacting the chemical oxide layer. The semiconductor structure further contains another gate dielectric including a semiconductor oxide-based dielectric portion and contacting a second surface of the semiconductor substrate, a U-shaped silicon oxynitride layer contacting the semiconductor oxide-based dielectric portion, and another U-shaped gate dielectric portion contacting inner sidewalls of the U-shaped silicon oxynitride layer.

According to yet another aspect of the present disclosure, a semiconductor device is provided. A dielectric layer including a first gate opening and a second gate opening is located on a substrate. Each opening exposes a surface of the substrate. A first gate oxide is located in the bottom of the first gate opening, and is in contact with the substrate. A second gate oxide is located in the second gate opening. The first gate oxide has a first thickness, and the second gate oxide has a bottom thickness where the second gate oxide contacts the substrate and a sidewall thickness along a sidewall of the second gate opening. The bottom thickness can be greater than the sidewall thickness, and can be greater than the first thickness. The first gate oxide can include an interfacial layer and a high k dielectric material.

According to still another aspect of the present disclosure, a method of making a semiconductor device is provided. First and second gate opening are provided in a dielectric layer on a substrate. The openings expose an initial oxide layer. The initial oxide layer is nitridated. A sacrificial oxide layer is formed over the nitridated initial oxide layer. The sacrificial oxide layer and the nitridized initial oxide layer can be removed from the first gate opening. An interfacial layer and high-k dielectric can be formed in the first and second gate openings.

BRIEF DESCRIPTION OF THE SEVERAL VIEWS OF THE DRAWINGS

FIG. 1 is a vertical cross-sectional view of a first exemplary semiconductor structure after formation of disposable gate structures according to a first embodiment of the present disclosure.

FIG. 2 is a vertical cross-sectional view of the first exemplary semiconductor structure after formation of gate spacers, source regions, drain regions, and a planarization dielectric layer according to the first embodiment of the present disclosure.

FIG. 3 is a vertical cross-sectional view of the first exemplary semiconductor structure after removal of disposable gate material portions according to the first embodiment of the present disclosure.

FIG. 4 is a vertical cross-sectional view of the first exemplary semiconductor structure after formation of a silicon oxide layer according to the first embodiment of the present disclosure.

FIG. 7 is a vertical cross-sectional view of the first exemplary semiconductor structure after removal of a first masking material layer and nitridation of physically exposed portions of the silicon oxide layer according to the first embodiment of the present disclosure.

FIG. 8 is a vertical cross-sectional view of the first exemplary semiconductor structure after removal of the metallic nitride layer according to the first embodiment of the present disclosure.

FIG. 9 is a vertical cross-sectional view of the first exemplary semiconductor structure after removal of one of the semiconductor oxide-based dielectric portions according to the first embodiment of the present disclosure.

FIG. 10 is a vertical cross-sectional view of the first exemplary semiconductor structure after removal of a second masking material layer according to the first embodiment of the present disclosure.

FIG. 11 is a vertical cross-sectional view of the first exemplary semiconductor structure after formation of a high dielectric constant (high-k) dielectric layer and a gate conductor layer according to the first embodiment of the present disclosure.

FIG. 12 is a vertical cross-sectional view of the first exemplary semiconductor structure after removal of materials from above a top surface of the planarization dielectric layer according to the first embodiment of the present disclosure.

FIG. 13 is a vertical cross-sectional view of a second exemplary semiconductor structure after removal of a portion of the silicon oxide layer according to a second embodiment of the present disclosure.

FIG. 14 is a vertical cross-sectional view of the first exemplary semiconductor structure after removal of a third masking material layer according to the second embodiment of the present disclosure.

FIG. 15 is a vertical cross-sectional view of the first exemplary semiconductor structure after formation of a high dielectric constant (high-k) dielectric layer and a gate conductor layer according to the second embodiment of the present disclosure.

FIG. 16 is a vertical cross-sectional view of the first exemplary semiconductor structure after removal of materials from above a top surface of the planarization dielectric layer according to the second embodiment of the present disclosure.

FIG. 19 is a vertical cross-sectional view of the third exemplary semiconductor structure after formation of gate dielectrics and gate electrodes according to the third embodiment of the present disclosure.

FIG. 20 is a vertical cross-sectional view of a fourth exemplary semiconductor structure after removal of a portion of the silicon oxynitride layer according to a fourth embodiment of the present disclosure.

DETAILED DESCRIPTION

Figure 5:
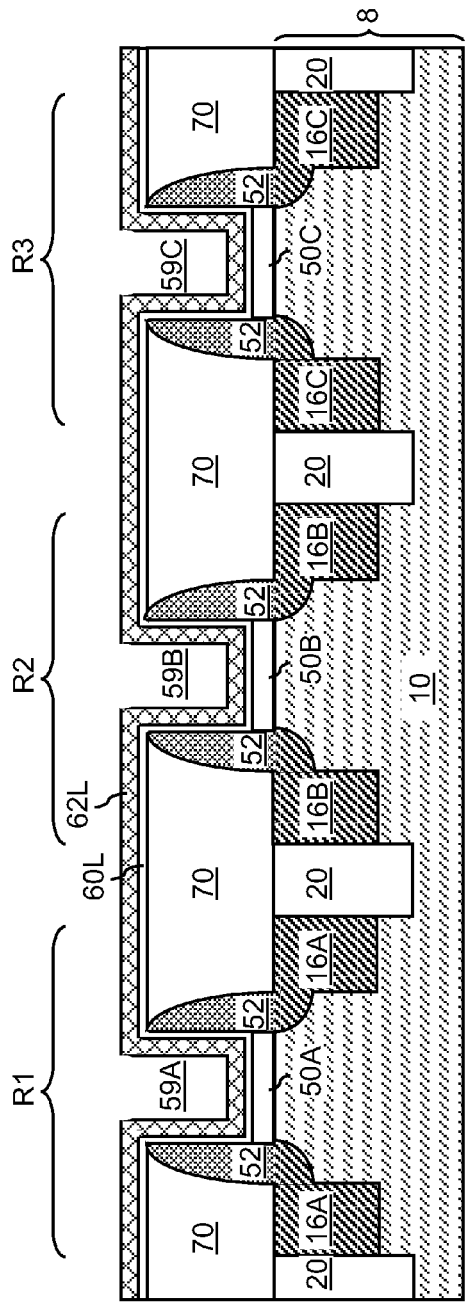
FIG. 5 is a vertical cross-sectional view of the first exemplary semiconductor structure after formation of a metallic nitride layer according to the first embodiment of the present disclosure.

As stated above, the present disclosure relates to a method of forming multiple gate dielectrics having different thicknesses, and structures formed by the same. Aspects of the present disclosure are now described in detail with accompanying figures. Like and corresponding elements mentioned herein and illustrated in the drawings are referred to by like reference numerals. The drawings are not necessarily drawn to scale. Ordinals are used merely to distinguish among similar elements, and different ordinals may be employed across the specification and the claims of the instant application.

Referring to FIG. 1, a first exemplary semiconductor structure according to a first embodiment of the present disclosure includes a semiconductor substrate 8 that includes a semiconductor material layer 10. Various semiconductor devices including field effect transistors can be subsequently formed on the semiconductor material layer 10. The semiconductor substrate 8 can be a bulk substrate including a bulk semiconductor material constituting the semiconductor material layer 10 throughout, or a semiconductor-on-insulator (SOI) substrate (not shown) containing a top semiconductor layer that constitutes a semiconductor material layer 10, a buried insulator layer (not shown) located under the top semiconductor layer, and a bottom semiconductor layer (not shown) located under the buried insulator layer.

Various portions of the semiconductor material in the semiconductor substrate 8 can be doped with electrical dopants of p-type or n-type at different dopant concentration levels. For example, the semiconductor substrate 8 may include at least one p-type well (not shown) and/or at least one n-type well (not shown). Shallow trench isolation structures 20 can be formed to laterally separate various surface regions of the semiconductor substrate 8.

A semiconductor oxide-based gate dielectric layer and a disposable gate material layer can be deposited on the top surface of the semiconductor substrate 8. The semiconductor oxide-based gate dielectric layer includes a semiconductor-oxide based dielectric material. As used herein, a "semiconductor oxide-based dielectric material" refers to an oxide-based dielectric material formed by a combination of a semiconductor material and oxygen and optionally at least another non-metallic, non-semiconductor element. As used herein, a "semiconductor material" can be any of elemental semiconductor materials known in the art, an alloy of at least two elemental semiconductor materials, a III-V compound semiconductor material, a II-VI compound semiconductor material, or a combination thereof. As used herein, an "oxide-based dielectric material" refers to a dielectric material in which oxygen accounts for more than 50% of all atoms that are not metallic atoms, elemental semiconductor atoms, or atoms of a compound semiconductor material. An oxide-based dielectric material may, or may not, include nitrogen. Thus, semiconductor oxide-based dielectric materials include all materials that are known to be derived from a semiconductor material by oxidation or oxynitridation such that more than 50% of all atoms that are not metallic atoms, elemental semiconductor atoms, or atoms of a compound semiconductor material. In an illustrative example, the semiconductor oxide-based gate dielectric layer can include silicon oxide, silicon oxynitride in which the atomic concentration of oxygen is greater than the atomic concentration of nitrogen, an oxide of a silicon-germanium alloy, an oxynitride of a silicon-germanium alloy in which the atomic concentration of oxygen is greater than the atomic concentration of nitrogen, an oxide of a semiconducting silicon-carbon alloy, or an oxynitride of a semiconducting silicon-carbon alloy in which the atomic concentration of oxygen is greater than the atomic concentration of nitrogen. In one embodiment, the semiconductor oxide-based gate dielectric layer can be a dielectric oxide material that consists essentially of oxygen and a semiconductor material, or consists essentially of oxygen, nitrogen, and a semiconductor material.

In one embodiment, the semiconductor oxide-based gate dielectric layer can be formed by thermal oxidation, a combination of thermal oxidation and thermal or plasma nitridation, plasma oxidation, a combination of plasma oxidation and thermal or plasma nitridation, of a physically exposed top portion of the semiconductor material layer 10. The thickness of the semiconductor oxide-based gate dielectric layer can be in a range from 1.5 nm to 10 nm, although lesser and greater thicknesses can also be employed.

The disposable gate material layer includes a material that can be subsequently removed selective to the material of the semiconductor oxide-based gate dielectric layer and selective to dielectric materials of gate spacers and a planarization dielectric layer to be subsequently deposited above the top surface of the semiconductor substrate 8. For example, the disposable gate material layer can include a semiconductor material such as silicon, germanium, a silicon germanium alloy, or a compound semiconductor material. Alternately, the disposable gate material layer can include any dielectric material or any metallic material that can be removed selective to the dielectric materials of the gate spacer and the dielectric layer to be subsequently deposited. Yet alternately, the disposable gate dielectric material layer can include an organic material, amorphous carbon, or any other disposable fill material known in the art provided that the disposable fill material can be removed selective to the material of the semiconductor oxide-based gate dielectric layer and selective to dielectric materials of gate spacers and a planarization dielectric layer to be subsequently deposited above the top surface of the semiconductor substrate 8. The thickness of the disposable gate material layer can be in a range from 30 nm to 600 nm, although lesser and greater thicknesses can also be employed.

The stack of the disposable gate material layer semiconductor oxide-based gate dielectric layer is subsequently lithographically patterned to form disposable gate structures. Each disposable gate structure includes a vertical stack of a semiconductor oxide-based gate dielectric portion and a disposable gate material portion. Each semiconductor oxide-based gate dialectic portion is a remaining portion of the semiconductor oxide-based gate dialectic layer, and each disposable gate material portion is a remaining portion of the disposable gate material layer.

For example, a first disposable gate material stack can include a first semiconductor oxide-based gate dialectic portion 50A and a first disposable gate material portion 51A formed in a first device region R1, a second disposable gate material stack can include a second semiconductor oxide-based gate dialectic portion 50B and a second disposable gate material portion 51B formed in a second device region R2, and a third disposable gate material stack can include a third semiconductor oxide-based gate dialectic portion 50C and a third disposable gate material portion 51C formed in a third device region R3.

Referring to FIG. 2, gate spacers 52 are formed on sidewalls of each of the disposable gate structures, for example, by deposition of a conformal dielectric material layer and an anisotropic etch. The conformal dielectric material layer includes a dielectric material that is resistant to the etch chemistry to be subsequently employed to remove the disposable gate material portions (51A, 51B, 51C). For example, the conformal dielectric material layer can include silicon oxide, silicon nitride, silicon oxynitride, a high dielectric constant dielectric material having a dielectric constant greater than 7.9 and including a dielectric oxide of a metal, or combinations thereof. The conformal dielectric material layer can be deposited, for example, by chemical vapor deposition (CVD) or atomic layer deposition (ALD). The anisotropic etch removes horizontal portions of the conformal dielectric material layer. Remaining vertical portions of the conformal dielectric material layer constitute the gate spacers 52.

At least one masked ion implantation process and/or at least one unmask ion implantation process can be performed before and/or after formation of the gate spacers 52. If a masked ion implantation is employed, a masking structure including a combination of a patterned masking material layer (not shown) and the disposable gate structures (50A, 51A, 50B, 51B, 50C, 51C) can be employed during the masked ion implantation process. If an unmasked ion implantation process is employed, the disposable gate structures (50A, 51A, 50B, 51B, 50C, 51C) can be employed as a masking structure during the unmasked ion implantation process. The at least one ion implantation process can form various doped active regions (16A, 16B, 16C) within the semiconductor material layer 10. As used herein, doped active regions collectively refer to source regions, drain regions, source extension regions, and drain extension regions as known in the art. Each doped active region (16A, 16C, or 16C) can have a doping of an opposite conductivity type than the portion of the semiconductor material layer 10 in which the doped active region (16A, 16C, or 16C) is formed.

A planarization dielectric layer 70 is formed above the doped active regions (16A, 16B, 16C) and at least up to the height of the top surface of the disposable gate structures (50A, 51A, 50B, 51B, 50C, 51C). The planarization dielectric layer 70 includes a dielectric material such as silicon oxide, silicon nitride, silicon oxynitride, a dielectric metal oxide, porous or non-porous organosilicate glass, or a combination thereof. In one embodiment, the planarization dielectric layer 70 includes a dielectric material that is resistant to the etch chemistry to be subsequently employed to remove the disposable gate material portions (51A, 51B, 51C).

In one embodiment, the planarization dielectric layer 70 including a spin-on dielectric material. In one embodiment, the planarization dielectric layer 70 can be formed by chemical vapor deposition (CVD) and/or atomic layer deposition (ALD). The planarization dielectric layer 70 can be planarized employing the top surfaces of the disposable gate material portions (51A, 51B, 51C) as stopping surfaces. The planarization of the planarization dielectric layer 70 can be effected, for example, by a recess etch or chemical mechanical planarization (CMP). The top surface of the planarization dielectric layer 70 can be coplanar with the top surfaces of the disposable gate material portions (51A, 51B, 51C). Thus, the planarization dielectric layer 70 is formed over the semiconductor substrate 8 and around the disposable gate structures (50A, 51A, 50B, 51B, 50C, 51C).

Referring to FIG. 3, the disposable gate material portions (51A, 51B, 51C) are removed selective to the semiconductor oxide-based gate dielectric portions (50A, 50B, 50C) by an etch process. The etch process can be an isotropic etch process (such as a wet etch process) or an anisotropic etch process (such as a reactive ion etch process). In one embodiment, the disposable gate material portions (51A, 51B, 51C) can be removed selective to the materials of the planarization dielectric layer 70 and the gate spacers 52. In an illustrative example, the disposable gate material portions (51A, 51B, 51C) can include germanium or a silicon-germanium alloy, and the etch process can be a wet etch process employing a combination of hydrogen peroxide and hydrofluoric acid.

A gate cavity is formed within each volume from which a disposable gate material portion (51A, 51B, or 51C) is removed. In other words, each volume from which a disposable gate material portion (51A, 51B, 51C) is removed constitutes a gate cavity. Thus, gate cavities surrounded by the planarization dielectric layer 70 is provided over the semiconductor substrate 8. A top surface of each semiconductor oxide-based dielectric portion (50A, 50B, 50C) is physically exposed at a bottom of each of the gate cavities (59A, 59B, 59C). The gate cavities can include a first gate cavity 59A formed in the first device region R1, a second gate cavity 59B formed in the second device region R2, and a third gate cavity 59C formed in the third device region R3.

Referring to FIG. 4, a silicon oxide layer 60L is formed by a conformal deposition method. The silicon oxide layer 60L is deposited on each of the semiconductor oxide-based dielectric portions (50A, 50B, 50C). In one embodiment, the silicon oxide layer 60L can be formed by atomic layer deposition (ALD) of silicon atoms and oxygen atoms. In an atomic layer deposition process, the first exemplary semiconductor structure can be loaded into a process chamber. After pumping the chamber to a base pressure in a range from about $10^{-3}$ Torr to $10^{-9}$ Torr, precursors of silicon atoms and oxygen gas can be alternately flowed into the process chamber to deposit the silicon oxide layer 60L. The silicon oxide layer 50L can be formed conformally on the semiconductor oxide-based dielectric portions (50A, 50B, 50C) and on the sidewalls of the gate cavities (59A, 59B, 59C). The silicon oxide layer 50L can consist essentially of silicon and have a stoichiometric composition, i.e., the ratio of 2:1 between the number of oxygen atoms and the number of silicon atoms. The thickness of the silicon oxide layer 50L can be in a range from 0.6 nm to 1.5 nm, although lesser and greater thicknesses can also be employed. In one embodiment, the thickness of the silicon oxide layer 50L can be in a range from 0.6 nm to 0.8 nm. In another embodiment, the thickness of the silicon oxide layer 50L can be in a range from 0.8 nm to 1.2 nm. In yet another embodiment, the thickness of the silicon oxide layer 50L can be in a range from 0.2 nm to 1.5 nm. The silicon oxide layer 50L Referring to FIG. 5, a metallic nitride layer 62L is deposited on the silicon oxide layer 60L. The metallic nitride layer 62L includes a nitride of a single elemental metal, or can include a nitride of an intermetallic compound of at least two metals. The metallic nitride layer 62L can include, for example, TiN, TaN, WN, alloys thereof, or a stack thereof. The metallic nitride layer 62L can be deposited by physical vapor deposition (PVD) or chemical vapor deposition (CVD). The thickness of the metallic nitride layer 62L can be in a range from 3 nm to 20 nm, although lesser and greater thicknesses can be employed.

Figure 6:
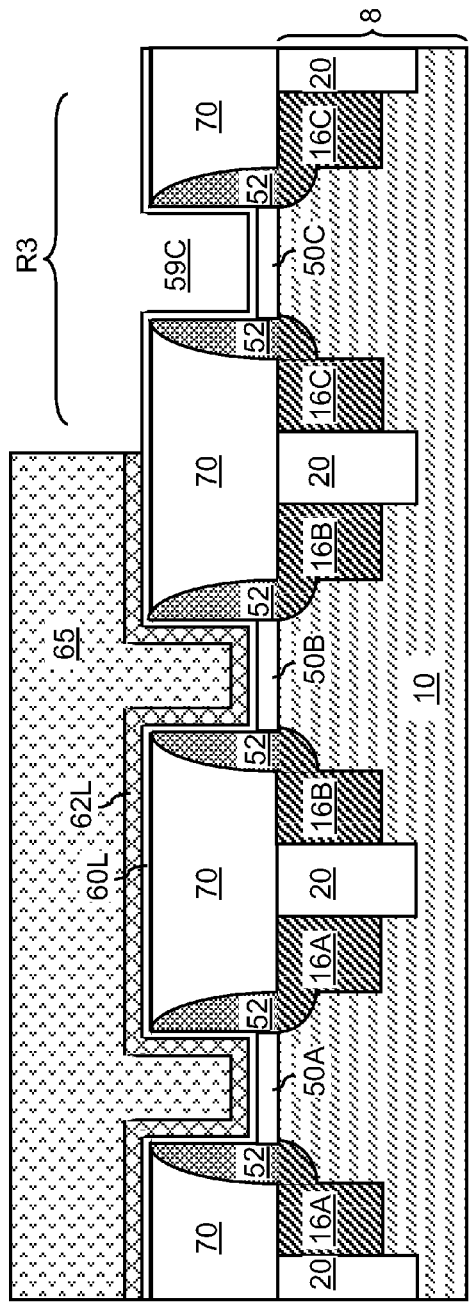
FIG. 6 is a vertical cross-sectional view of the first exemplary semiconductor structure after lithographic patterning of the metallic nitride layer according to the first embodiment of the present disclosure.

Referring to FIG. 6, the metallic nitride layer 62L can be lithographically patterned. Specifically, a first masking material layer 65 can be applied over the metallic nitride layer 62L, and can be lithographically patterned to cover the first and second device regions (R1, R2), while physically exposing portions of the metallic nitride layer 62L in the third device region R3. For example, the first masking material layer 65 can be a photoresist layer. The metallic nitride layer 62L is etched selective to the dielectric material of the silicon oxide layer 62L. The removal of the physically exposed portions of the metallic nitride layer 62L can be performed by an isotropic etch such as a wet etch. Remaining portions of the metallic nitride layer 62L are present within the first and second gate cavities (59A, 59B; See FIG. 5). The metallic nitride layer 62L is not present within the third gate cavity 59C, and surfaces of the silicon oxide layer 62L are physically exposed in the third device region R3. The first masking material layer 65 is subsequently removed selective to the metallic nitride layer 62L and the silicon oxide layer 60L, for example, by ashing.

Referring to FIG. 7, a nitridation process is performed to nitridate the physically exposed portions of the silicon oxide layer 62L into a silicon oxynitride layer 60'. The metallic nitride layer 60L prevents nitridation of the underlying portions of the silicon oxide layer 60L during the nitridation process. Nitrogen is incorporated into the physically exposed portions of the silicon oxide layer 62L to convert the physically exposed portions into the silicon oxynitride layer 60'. The silicon oxynitride layer 60' includes silicon oxynitride having a composition of $SiO_xN_y$, in which x is greater than y. The thickness of the silicon oxynitride layer 60' can be in a range from 0.6 nm to 1.5 nm, although lesser and greater thicknesses can also be employed. The nitridation process can be a thermal nitridation process or a plasma nitridation process. The silicon oxynitride layer 60' is more etch resistant to hydrofluoric acid than the silicon oxide layer 60L.

Referring to FIG. 8, the metallic nitride layer 62L is removed selective to the silicon oxide layer 60L and the silicon oxynitride layer 60'. The removal of the metallic nitride layer 62L can be performed by a wet etch chemistry as known in the art such that the metallic nitride material is removed without removing silicon oxide or silicon oxynitride.

Referring to FIG. 9, a second masking material layer 67 can be applied over the first exemplary semiconductor structure and lithographically patterned to cover the second device region R2 and the third device region R3. The second masking material layer 67 can be a photoresist layer. The portion of the silicon oxide layer 60L in the first device region R1 and the first semiconductor oxide-based gate dielectric portion 50A in the first gate cavity 59A are removed by an etch, which can be a wet etch employing hydrofluoric acid. A surface of the semiconductor substrate 8 is physically exposed at the bottom of the first gate cavity 59A, while the second masking material layer 67 prevents removal of the remaining portion of the silicon oxide layer 60 in the second device region R2 (See FIG. 8) and the silicon oxynitride layer 60' in the third device region R3 (See FIG. 8).

Referring to FIG. 10, the second masking material layer 67 is subsequently removed, for example, by ashing.

Referring to FIG. 11, a chemical oxide layer 40 can be optionally formed on the top surface of the semiconductor material layer 10 within the first gate cavity 59A by treatment with an oxidizing chemical. As used herein, a "chemical oxide" refers to a dielectric oxide of a semiconductor material that is formed by surface treatment of the semiconductor material by an oxidizing chemical. For example, the chemical oxide layer 40 can be formed employing a solution including hydrogen peroxide. In one embodiment, the semiconductor material layer 10 can include silicon, and the chemical oxide layer 40 can include silicon oxide. The thickness of the chemical oxide layer 40 can be in a range from 0.2 nm to 0.6 nm, although lesser and greater thicknesses can also be employed.

A high dielectric constant (high-k) dielectric layer 80L and a gate conductor layer 82L are deposited in the gate cavities (59A, 59B, 59C). The high-k dielectric layer 80L is deposited directly on the top surface of the chemical oxide layer 40, the top surface of the second semiconductor oxide-based gate dielectric portion 50B, the silicon oxide layer 60, and the silicon oxynitride layer 60'.

The high-k dielectric layer 80L is deposited in the gate cavities (59A, 59B, 59C) and over the gate spacers 52 and the planarization dielectric layer 70. The high-k dielectric layer 80L can be a high dielectric constant (high-k) material layer having a dielectric constant greater than 3.9. The high-k dielectric layer 80L can include a dielectric metal oxide, which is a high-k material containing a metal and oxygen, and is known in the art as high-k gate dielectric materials. Dielectric metal oxides can be deposited by, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 80L, as measured at horizontal portions, can be from 0.9 nm to 6 nm, and preferably from 1.0 nm to 3 nm. The high-k dielectric layer 80L may have an effective oxide thickness on the order of or less than 2 nm.

The gate conductor layer 82L is deposited on the high-k dielectric layer 80L. The gate conductor layer 82L can include a metallic material that can optimize the threshold voltages of transistors. For example, the gate conductor layer 82L can include metallic materials such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, conductive nitrides thereof, and alloys thereof. In addition, the gate conductor layer 82L can optionally include an aluminum layer, an aluminum alloy layer, a tungsten layer, and/or a tungsten alloy layer deposited by physical vapor deposition. Alternately or additionally, the gate conductor layer 82L can include a doped semiconductor material such as doped polysilicon or a doped polycrystalline silicon-germanium alloy. The gate conductor layer 82L can be formed, for example, by physical vapor deposition, chemical vapor deposition, or atomic layer deposition (ALD). The thickness of the gate conductor layer 82L, as measured above the top surface of the planarization dielectric layer 70, can be from 2 nm to 40 nm, although lesser and greater thicknesses can also be employed.

Referring to FIG. 12, the gate conductor layer 82L is removed from above the top surface of the planarization dielectric layer 70 by planarization. Optionally, the portions of the high-k dielectric layer 80L and the portions of the silicon oxynitride layer 60' located above the horizontal plane of the top surface of the planarization dielectric layer 70 can also be removed by planarization. The planarization can be performed, for example, by a recess etch, chemical mechanical planarization (CMP), or a combination thereof.

A remaining portion of the high-k dielectric layer 80L in the first device region R1 constitutes a first U-shaped gate dielectric portion 80A. As used herein, a "U-shaped" element refers to an element having a horizontal portion including a horizontal top surface and a horizontal bottom surface, and vertical portions that extend upward vertically from all peripheries of the horizontal portion. A remaining portion of the gate conductor layer 82L in the first device region R1 constitutes a first gate electrode 82A. Another remaining portion of the high-k dielectric layer 80L in the second device region R2 constitutes a second U-shaped gate dielectric portion 80B. Another remaining portion of the gate conductor layer 82L in the second device region R2 constitutes a second gate electrode 82B. Yet another remaining portion of the high-k dielectric layer 80L in the third device region R3 constitutes a third U-shaped gate dielectric portion 80C. Yet another remaining portion of the gate conductor layer 82L in the third device region R3 constitutes a third gate electrode 82C. The top surfaces of the various U-shaped gate dielectric portions (80A, 80B, 8C) and the top surfaces of the various gate electrodes (82A, 82B, 82C) can be coplanar with the top surface of the planarization dielectric layer 70.

The first exemplary semiconductor structure contains a gate dielectric (40, 80A) including a chemical oxide layer 40 contacting a first surface of a semiconductor substrate 8 and a U-shaped gate dielectric portion (e.g., the first U-shaped gate dielectric portion 80A) including a high dielectric constant (high-k) gate dielectric material contacting the chemical oxide layer 40. The first exemplary semiconductor structure contains another gate dielectric (50C, 60', 80C) including a semiconductor oxide-based dielectric portion (e.g., the third semiconductor oxide-based dielectric portion 50C) and contacting a second surface of the semiconductor substrate 8, a U-shaped silicon oxynitride layer (e.g., the silicon oxynitride layer 60') contacting the third semiconductor oxide-based dielectric portion 50C, and another U-shaped gate dielectric portion (e.g., the third U-shaped gate dielectric portion 80C) contacting inner sidewalls of the U-shaped silicon oxynitride layer. The first exemplary semiconductor structure contains yet another gate dielectric (50B, 60, 80B) including another semiconductor oxide-based dielectric portion (e.g., the second semiconductor oxide-based dielectric portion 50B) and contacting a third surface of the semiconductor substrate 8, a U-shaped silicon oxide layer (e.g., the silicon oxide layer 60) contacting the second semiconductor oxide-based dielectric portion 50B, and yet another U-shaped gate dielectric portion (e.g., the second U-shaped gate dielectric portion 80B) contacting inner sidewalls of the U-shaped silicon oxide layer 60.

In one embodiment, the U-shaped gate dielectric portion (e.g., first U-shaped gate dielectric portion 80A) and the other U-shaped gate dielectric portion (e.g., the third U-shaped gate dielectric portion 80C) and the yet another U-shaped gate dielectric portion (e.g., the second U-shaped gate dielectric portion 80B) can have the same composition and the same thickness. In one embodiment, the chemical oxide layer 40 can have a thickness in a range from 0.2 nm to 0.6 nm, and each semiconductor oxide-based dielectric portion (50B, 50C) can have a thickness in a range from 1.5 nm to 10 nm. In one embodiment, the U-shaped silicon oxynitride layer, i.e., the silicon oxynitride layer 60', can be a conformal layer having a same thickness throughout the entirety thereof. The thickness can be in a range from 0.6 nm to 1.5 nm.

In one embodiment, the U-shaped gate dielectric portion (e.g., the first U-shaped gate dielectric portion 80A) and the other U-shaped gate dielectric portion (e.g., the third U-shaped gate dielectric portion 80C) and the yet another U-shaped gate dielectric portion (e.g., the second U-shaped gate dielectric portion 80B) can include a dielectric metal oxide having a dielectric constant greater than 8.0. The first exemplary semiconductor oxide can further include a gate electrode (e.g., the first gate electrode 82A) contacting inner sidewalls of the U-shaped gate dielectric portion (e.g., the first U-shaped gate dielectric portion 80A), and another gate electrode (e.g., the third gate electrode 82C) contacting inner sidewalls of the other U-shaped gate dielectric portion (e.g., the third U-shaped gate dielectric portion 80C), and yet another gate electrode (e.g., the second gate electrode 82B)

contacting inner sidewalls of the yet another U-shaped gate dielectric portion (e.g., the second U-shaped gate dielectric portion 80B).

A gate spacer (e.g., the gate spacer 52 in the first device region R1) can contact outer sidewalls of vertical portions of the U-shaped gate dielectric portion (e.g., the first U-shaped gate dielectric portion 80A). Another gate spacer (e.g., the gate spacer 52 in the third device region R3) can contact outer sidewalls of vertical portions of the U-shaped silicon oxynitride layer (e.g., the silicon oxynitride layer 60'). Yet another gate spacer (e.g., the gate spacer 52 in the second device region R2) can contact outer sidewalls of vertical portions of the U-shaped silicon oxide layer (e.g., the silicon oxide layer 60).

Referring to FIG. 13, a second exemplary semiconductor structure can be derived from the first exemplary semiconductor structure illustrated in FIG. 10 by forming a third masking material layer 69 and by removing the silicon oxide layer 60 selective to the dielectric material of the second semiconductor oxide-based dielectric portion 50B. Specifically, the third masking material layer 69 can be applied over the first exemplary semiconductor structure of FIG. 10, and can be lithographically patterned to cover the third device region R3 to form the second exemplary semiconductor structure. The second masking material layer 67 can be a photoresist layer. The portion of the silicon oxide layer 60L in the second device region R2 is removed by an etch, which can be a wet etch employing hydrofluoric acid. A top surface of the second semiconductor oxide-based gate dielectric portion 50A is physically exposed at the bottom of the second gate cavity 59B, while the third masking material layer 69 prevents removal of the silicon oxynitride layer 60' in the third device region R3 (See FIG. 10).

Referring to FIG. 14, the third masking material layer 69 is subsequently removed, for example, by ashing.

Referring to FIG. 15, the processing steps of FIG. 11 can be performed to form a chemical oxide layer 40, and to deposit a high-k dielectric layer 80L and a gate conductor layer 82L in the gate cavities (59A, 59B, 59C). The high-k dielectric layer 80L is deposited directly on the top surface of the chemical oxide layer 40, the top surface of the second semiconductor oxide-based gate dielectric portion 50B, and the silicon oxynitride layer 60'. The high-k dielectric layer 80L and the gate conductor layer 82L can have the same composition and the same thickness as in the first embodiment.

Referring to FIG. 16, the gate conductor layer 82L is removed from above the top surface of the planarization dielectric layer 70 by planarization. Optionally, the portions of the high-k dielectric layer 80L and the portions of the silicon oxynitride layer 60' located above the horizontal plane of the top surface of the planarization dielectric layer 70 can also be removed by planarization. The planarization can be performed, for example, by a recess etch, chemical mechanical planarization (CMP), or a combination thereof.

A remaining portion of the high-k dielectric layer 80L in the first device region R1 constitutes a first U-shaped gate dielectric portion 80A. As used herein, a "U-shaped" element refers to an element having a horizontal portion including a horizontal top surface and a horizontal bottom surface, and vertical portions that extend upward vertically from all peripheries of the horizontal portion. A remaining portion of the gate conductor layer 82L in the first device region R1 constitutes a first gate electrode 82A. Another remaining portion of the high-k dielectric layer 80L in the second device region R2 constitutes a second U-shaped gate dielectric portion 80B. Another remaining portion of the gate conductor layer 82L in the second device region R2 constitutes a second gate electrode 82B. Yet another remaining portion of the high-k dielectric layer 80L in the third device region R3 constitutes a third U-shaped gate dielectric portion 80C. Yet another remaining portion of the gate conductor layer 82L in the third device region R3 constitutes a third gate electrode 82C. The top surfaces of the various U-shaped gate dielectric portions (80A, 80B, 80C) and the top surfaces of the various gate electrodes (82A, 82B, 82C) can be coplanar with the top surface of the planarization dielectric layer 70.

The second exemplary semiconductor structure contains a gate dielectric (40, 80A) including a chemical oxide layer 40 contacting a first surface of a semiconductor substrate 8 and a U-shaped gate dielectric portion (e.g., the first U-shaped gate dielectric portion 80A) including a high dielectric constant (high-k) gate dielectric material contacting the chemical oxide layer 40. The second exemplary semiconductor structure contains another gate dielectric (50C, 60', 80C) including a semiconductor oxide-based dielectric portion (e.g., the third semiconductor oxide-based dielectric portion 50C) and contacting a second surface of the semiconductor substrate 8, a U-shaped silicon oxynitride layer (e.g., the silicon oxynitride layer 60') contacting the third semiconductor oxide-based dielectric portion 50C, and another U-shaped gate dielectric portion (e.g., the third U-shaped gate dielectric portion 80C) contacting inner sidewalls of the U-shaped silicon oxynitride layer.

In one embodiment, the U-shaped gate dielectric portion (e.g., first U-shaped gate dielectric portion 80A) and the other U-shaped gate dielectric portion (e.g., the third U-shaped gate dielectric portion 80C) can have the same composition and the same thickness. In one embodiment, the chemical oxide layer 40 can have a thickness in a range from 0.2 nm to 0.6 nm, and each semiconductor oxide-based dielectric portion (50B, 50C) can have a thickness in a range from 1.5 nm to 10 nm. In one embodiment, the U-shaped silicon oxynitride layer, i.e., the silicon oxynitride layer 60', can be a conformal layer having a same thickness throughout the entirety thereof. The thickness can be in a range from 0.6 nm to 1.5 nm.

In one embodiment, the U-shaped gate dielectric portion (e.g., the first U-shaped gate dielectric portion 80A) and the other U-shaped gate dielectric portion (e.g., the third U-shaped gate dielectric portion 80C) can include a dielectric metal oxide having a dielectric constant greater than 8.0. The first exemplary semiconductor oxide can further include a gate electrode (e.g., the first gate electrode 82A) contacting inner sidewalls of the U-shaped gate dielectric portion (e.g., the first U-shaped gate dielectric portion 80A), and another gate electrode (e.g., the third gate electrode 82C) contacting inner sidewalls of the other U-shaped gate dielectric portion (e.g., the third U-shaped gate dielectric portion 80C).

A gate spacer (e.g., the gate spacer 52 in the first device region R1) can contact outer sidewalls of vertical portions of the U-shaped gate dielectric portion (e.g., the first U-shaped gate dielectric portion 80A). Another gate spacer (e.g., the gate spacer 52 in the third device region R3) can contact outer sidewalls of vertical portions of the U-shaped silicon oxynitride layer (e.g., the silicon oxynitride layer 60').

The second exemplary semiconductor structure can include yet another gate dielectric (50B, 80B) including another semiconductor oxide-based dielectric portion (e.g., the second semiconductor oxide-based gate dielectric portion 50B) and contacting a third surface of the semiconductor substrate 8, and yet another U-shaped gate dielectric portion (e.g., the second U-shaped gate dielectric portion 80B) contacting the other semiconductor oxide-based dielectric portion. In one embodiment, the U-shaped gate dielectric portion (e.g., the first U-shaped gate dielectric portion 80A), the other U-shaped gate dielectric portion (e.g., the third U-shaped gate dielectric portion 80C), and the yet other U-shaped gate dielectric portion (e.g., the second U-shaped gate dielectric portion 80B) can have the same composition and the same thickness. A gate spacer (e.g., the gate spacer 52 in the second device region R2) can contact outer sidewalls of the yet other U-shaped gate dielectric portion (e.g., the second U-shaped gate dielectric portion 80B).

Variations of the second embodiment are expressly contemplated herein in which the patterning step employing the second masking material layer 67 is omitted, and/or the patterning step employing the third masking material layer 69 is omitted.

Figure 17:
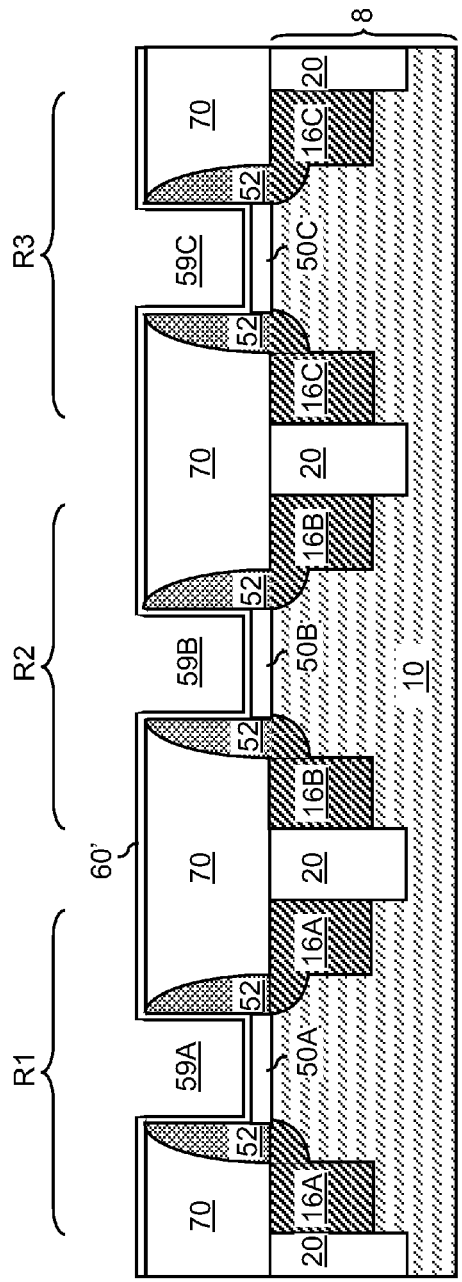
FIG. 17 is a vertical cross-sectional view of a third exemplary semiconductor structure after nitridation of a silicon oxide layer to form a silicon oxynitride layer according to a third embodiment of the present disclosure.

Referring to FIG. 17, a third exemplary semiconductor structure can be derived from the first exemplary semiconductor structure of FIG. 4 by performing the processing step of FIG. 7 without performing the processing steps of FIGS. 5 and 6. The entirety of the silicon oxide layer 60L is converted into a silicon oxynitride layer 60', which can have the same thickness and the same composition as in the first embodiment. The thickness of the silicon oxynitride layer 60' can be the same throughout the entirety thereof.

Figure 18:
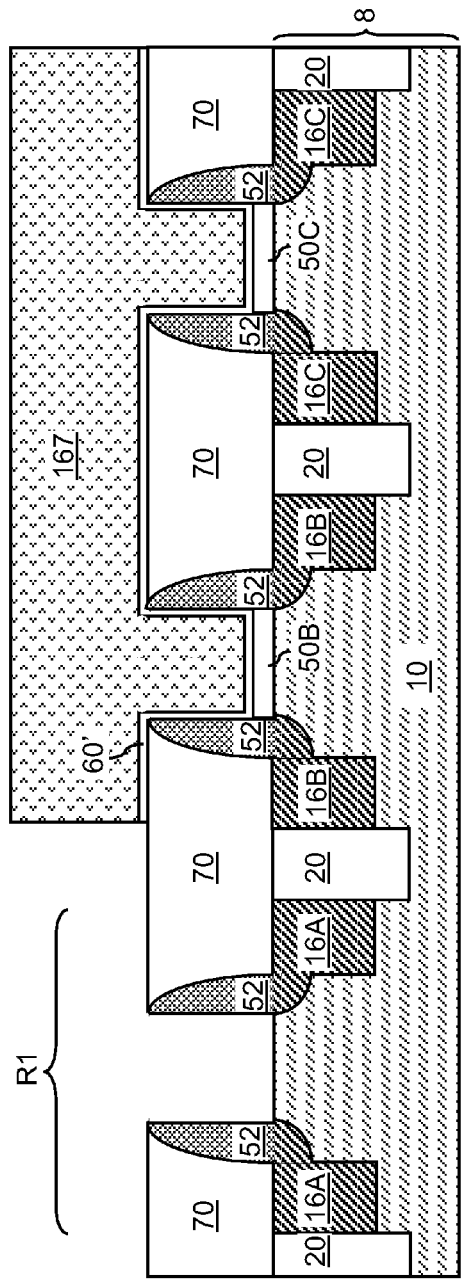
FIG. 18 is a vertical cross-sectional view of the third exemplary semiconductor structure after lithographic patterning of the silicon oxynitride layer according to the third embodiment of the present disclosure.

Referring to FIG. 18, a masking material layer 167 can be applied over the third exemplary semiconductor structure and lithographically patterned to cover the second device region R2 and the third device region R3. The masking material layer 167 can be a photoresist layer. The portion of the silicon oxide layer 60L in the first device region R1 and the first semiconductor oxide-based gate dielectric portion 50A in the first gate cavity 59A are removed by an etch, which can be a wet etch employing hydrofluoric acid. A surface of the semiconductor substrate 8 is physically exposed at the bottom of the first gate cavity 59A, while the second masking material layer 167 prevents removal of the remaining portion of the silicon oxynitride layer 60' in the second device region R2 and in the third device region R3 (See FIG. 15). The masking material layer 167 is subsequently removed, for example, by ashing.

Referring to FIG. 19, the processing steps of FIGS. 11 and 12 can be performed to form various gate dielectrics and gate electrodes. In the third embodiment, the gate dielectric (50B, 60', 80B) located in the second device region R2 includes a stack of the second semiconductor oxide-based gate dielectric portion 50B, a silicon oxynitride layer 60' having the same composition and thickness as another silicon oxynitride layer 60' located in the third device region R2, and the second U-shaped gate dielectric portion 80B.

Referring to FIG. 20, a fourth exemplary semiconductor structure can be derived from the third exemplary semiconductor structure of FIG. 18 by removing the masking material layer 67, by applying and patterning another masking material layer 269 such that the other masking material layer 269 covers the third device region R3, and removing physically exposed portions of the silicon oxynitride layer 60' employing a wet etch selective to the dielectric material of the second semiconductor-oxide based gate dielectric portion 50B. The concentration of the wet etch solution and the duration of the etch can be controlled to minimize, or prevent, the etching of the second semiconductor-oxide based gate dielectric portion 50B. The other masking material layer 269 can be subsequently removed, for example, by ashing.

Figure 21:
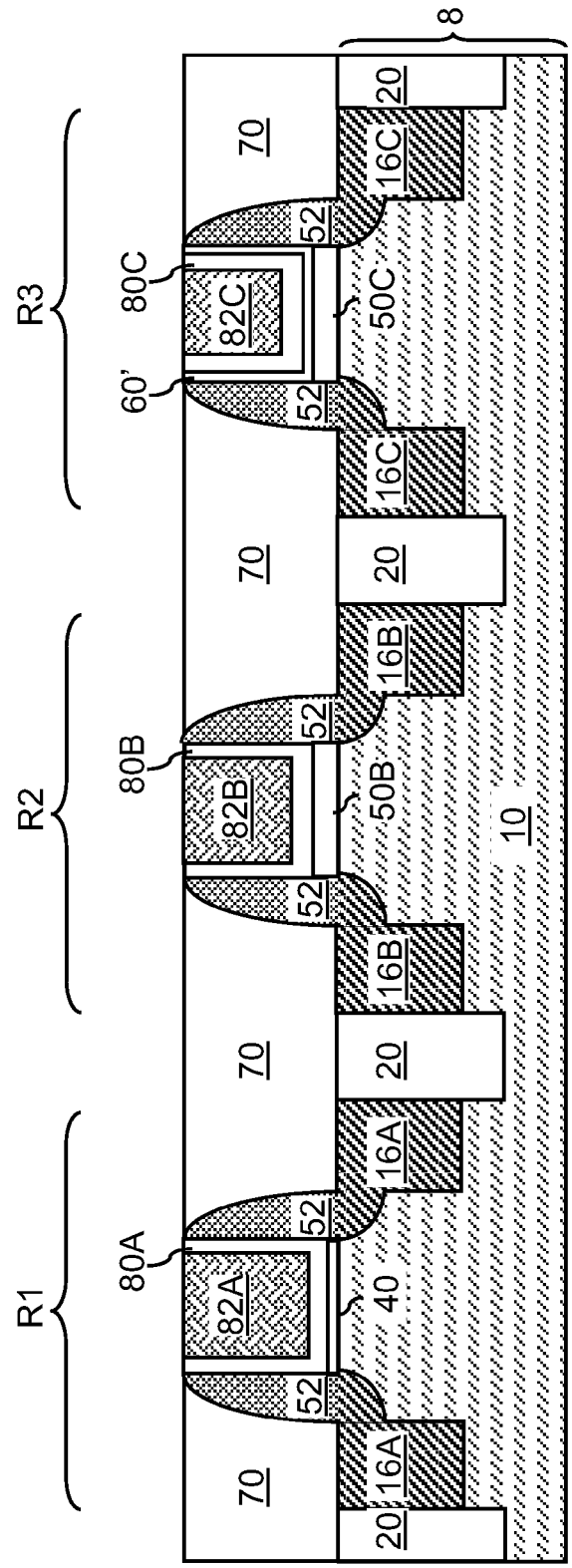
FIG. 21 is a vertical cross-sectional view of the fourth exemplary semiconductor structure after formation of gate dielectrics and gate electrodes according to the fourth embodiment of the present disclosure.

Referring to FIG. 21, the processing steps of FIGS. 15 and 16 can be subsequently performed to form the same type of structure as the second exemplary semiconductor structure illustrated in FIG. 16.

The various embodiments of the present disclosure can be employed to provide multiple types of gate dielectrics having different thicknesses. Multiple instances of each of the first device region R1, the second device region R2, and the third device region R3 may be formed in each embodiment. Further, any of the first device region R1, the second device region R2, and the third device region R3 may be omitted in each embodiment. In some embodiment, a plurality of first device regions R1 can be provided in any of the embodiments described above, and at least one p-type field effect transistor and at least one n-type field effect transistor can be formed in the plurality of first device regions R1. Additionally or alternately, a plurality of second device regions R2 can be provided in any of the embodiments described above, and at least one p-type field effect transistor and at least one n-type field effect transistor can be formed in the plurality of second device regions R2. Additionally or alternately, a plurality of third device regions R3 can be provided in any of the embodiments described above, and at least one p-type field effect transistor and at least one n-type field effect transistor can be formed in the plurality of third device regions R3.

The atomic layer deposition of the silicon oxide layer forms a silicon oxide layer that is comparable to thermal oxide in terms of density (i.e., mass divided by volume) and defect density (i.e., the count of physically defective locations within a unit volume), and far superior to any silicon oxide layer formed by chemical vapor deposition that includes at least hydrogen at parts per million (p.p.m.) level. Thus, the silicon oxide layer deposited by the atomic layer deposition can consist of silicon and oxygen without even any p.p.m. level of hydrogen. For the same reason, the silicon oxynitride layer formed by nitridation of atomic layer deposition silicon oxide can consist of silicon, oxygen, and nitrogen without even any p.p.m. level of hydrogen. The silicon oxide layer deposited by atomic layer deposition has a high density that is the same as thermal silicon oxide, and can be denser than silicon oxide that can be deposited by chemical vapor deposition. The high density and the low defect density of the silicon oxide layer formed by atomic layer deposition provide excellent leakage characteristics comparable to the leakage characteristics of thermal oxide. Thus, for a given thickness, the atomic layer deposition silicon oxide provides lesser leakage current than chemical vapor deposition silicon oxide. Likewise, for a given thickness, the silicon oxynitride layer formed by atomic layer deposition and nitridation provides lesser leakage current than silicon oxynitride formed by chemical vapor deposition and nitridation. Therefore, the high density and the low defect density of a silicon oxide layer formed by atomic layer deposition and/or the high density and the low defect density of a silicon oxynitride layer derived from such as silicon oxide layer can provide gate dielectric materials that are superior in terms of reliability (i.e., lesser failure rate during the lifetime of a device) that gate dielectric materials employing chemical vapor deposition silicon oxide or an oxynitride derived therefrom. Thus, the gate dielectrics of the present disclosure can provide more reliable performance during the lifetime of semiconductor devices than other gate dielectrics known in the art.

An advantage of the present invention is that gates having differing oxide thicknesses can be formed. Gates having differing oxide thicknesses may occur because standard gates require thinner oxide whereas gates used for I/O transistors require thicker oxides. The invention also allows for different dielectric stacks within different types of gates.

Another advantage of the present invention is that it allows the formation of a thick oxide gate which has a thicker total oxide on the bottom than the sidewall of the gate. This is important in a replacement metal gate scenario because merely depositing a thick oxide layer in a replacement metal gates makes the aspect ratio of the opening for the metal gate very aggressive which is hard to fill. The methods taught in the present invention provide for a thicker total oxide at the bottom of the replacement metal gate opening versus the sidewall of the opening. Therefore, a lower aspect ratio opening is maintained such that it is easier to fill with metal gate material, but the advantages of a thick gate oxide are also achieved.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
   a gate dielectric comprising a chemical oxide layer contacting a first surface of a semiconductor substrate and a U-shaped gate dielectric portion comprising a high dielectric constant (high-k) gate dielectric material contacting said chemical oxide layer; and
   another gate dielectric comprising a semiconductor oxide-based dielectric portion and contacting a second surface of said semiconductor substrate, a U-shaped silicon oxynitride layer contacting said semiconductor oxide-based dielectric portion, and another U-shaped gate dielectric portion contacting inner sidewalls of said U-shaped silicon oxynitride layer.

2. The semiconductor structure of claim 1, wherein said U-shaped gate dielectric portion and said another U-shaped gate dielectric portion have a same composition and a same thickness.

3. The semiconductor structure of claim 1, wherein said chemical oxide layer has a thickness in a range from 0.2 nm to 0.6 nm, and said semiconductor oxide-based dielectric portion has a thickness in a range from 1.5 nm to 10 nm.

4. The semiconductor structure of claim 1, wherein said U-shaped silicon oxynitride layer is a conformal layer having a same thickness throughout an entirety thereof, wherein said same thickness is in a range from 0.6 nm to 1.5 nm.

5. The semiconductor structure of claim 1, wherein said U-shaped gate dielectric portion and said another U-shaped gate dielectric portion comprise a dielectric metal oxide having a dielectric constant greater than 8.0.

6. The semiconductor structure of claim 1, further comprising:
   a gate electrode contacting inner sidewalls of said U-shaped gate dielectric portion; and
   another gate electrode contacting inner sidewalls of said another U-shaped gate dielectric portion.

7. The semiconductor structure of claim 1, further comprising:
   a gate spacer contacting outer sidewalls of vertical portions of said U-shaped gate dielectric portion; and
   another gate spacer contacting outer sidewalls of vertical portions of said U-shaped silicon oxynitride layer.

8. The semiconductor structure of claim 1, further comprising yet another gate dielectric comprising another semiconductor oxide-based dielectric portion and contacting a third surface of said semiconductor substrate, and yet another U-shaped gate dielectric portion contacting said another semiconductor oxide-based dielectric portion.

9. The semiconductor structure of claim 8, wherein said U-shaped gate dielectric portion, said another U-shaped gate dielectric portion, and said yet another U-shaped gate dielectric portion have a same composition and a same thickness.

10. The semiconductor structure of claim 1, further comprising yet another gate dielectric comprising another semiconductor oxide-based dielectric portion and contacting a third surface of said semiconductor substrate, a U-shaped silicon oxide layer contacting said another silicon-oxide based dielectric portion, and yet another U-shaped gate dielectric portion contacting inner sidewalls of said U-shaped silicon oxide layer.

* * * * *